United States Patent
Elliott et al.

(10) Patent No.: US 6,573,522 B2
(45) Date of Patent: Jun. 3, 2003

(54) LOCATOR PIN INTEGRATED WITH SENSOR FOR DETECTING SEMICONDUCTOR SUBSTRATE CARRIER

(75) Inventors: Martin R. Elliott, Round Rock, TX (US); Jeffrey C. Hudgens, San Francisco, CA (US)

(73) Assignee: Applied Matrials, Inc., Santa Clara, CA (US)

( * ) Notice: Subject to any disclaimer, the term of this patent is extended or adjusted under 35 U.S.C. 154(b) by 0 days.

(21) Appl. No.: 09/894,383

(22) Filed: Jun. 27, 2001

(65) Prior Publication Data

US 2003/0001116 A1 Jan. 2, 2003

(51) Int. Cl.[7] .............................................. G01N 21/86
(52) U.S. Cl. .............................. 250/559.4; 250/559.12; 414/940
(58) Field of Search ........................ 250/559.29, 559.33, 250/221, 559.4, 559.12, 551, 559.3; 414/935, 936, 940

(56) References Cited

U.S. PATENT DOCUMENTS

| | | | |
|---|---|---|---|
| 4,952,299 A | 8/1990 | Chrisos et al. | 204/298.25 |
| 5,525,024 A | 6/1996 | Freerks et al. | 414/416 |
| 5,844,683 A | 12/1998 | Pavloski et al. | 356/399 |
| 5,885,045 A | 3/1999 | Rush | 414/417 |
| 5,899,216 A | 5/1999 | Goudie et al. | 134/61 |
| 5,970,621 A | * 10/1999 | Bazydola et al. | 33/613 |
| 6,060,721 A | * 5/2000 | Huang | 250/559.4 |
| 6,082,951 A | 7/2000 | Nering et al. | 414/217.1 |
| 6,113,694 A | 9/2000 | Davis | 116/663 |

FOREIGN PATENT DOCUMENTS

| | | |
|---|---|---|
| WO | 98/01892 | 1/1998 |
| WO | 98/42008 | 9/1998 |
| WO | 99/61678 | 12/1999 |
| WO | 00/02804 | 1/2000 |
| WO | 00/20167 | 4/2000 |
| WO | 00/37338 | 6/2000 |

\* cited by examiner

*Primary Examiner*—Stephone B. Allen
*Assistant Examiner*—Christopher W. Glass
(74) *Attorney, Agent, or Firm*—Dugan & Dugan LLP.

(57) ABSTRACT

A storage surface for a semiconductor substrate carrier has substrate carrier sensors that are integrated with locator pins. Each locator pin includes a pin body mounted on, and extending upwardly from, the surface. The pin body has a slot formed at an upper portion of the pin body. A paddle is mounted in the slot of the pin body and is adapted to be actuated in a downward direction when a substrate carrier is seated on the pin body. The pin body has an uppermost point, and when the paddle is unactuated, the paddle does not extend above the uppermost point of the pin body.

27 Claims, 5 Drawing Sheets

LOCATOR PIN INTEGRATED WITH SENSOR FOR DETECTING SEMICONDUCTOR SUBSTRATE CARRIER

FIELD OF THE INVENTION

The present invention relates to semiconductor manufacturing, and more particularly to an apparatus for detecting the presence of a carrier in which semiconductor substrates are stored and/or transported.

BACKGROUND OF THE INVENTION

Semiconductor devices are made on substrates, such as silicon wafers or glass plates, for use in computers, monitors, and the like. These devices are made by a sequence of fabrication steps, such as thin film deposition, oxidation or nitration, etching, polishing, and thermal and lithographic processing. Although multiple fabrication steps may be performed in a single processing station, substrates must be transported between processing stations for at least some of the fabrication steps.

Substrates are stored in open cassettes or sealed pods (hereinafter referred to collectively as "substrate carriers") for transfer between processing stations and other locations. Although substrate carriers may be carried manually between processing stations, the transfer of substrate carriers is typically automated.

Placement of a substrate carrier precisely at a predetermined position and alignment on a processing station or storage location may be of critical importance, particularly when the substrate carrier is to be removed from the processing station or storage location by an automated device, or when a substrate-handling robot is to remove substrates from the substrate carrier. To accommodate the need for precise and automatic placement of substrate carriers at processing stations and storage locations, an organization referred to as "SEMI" (Semiconductor Equipment and Materials International) has prescribed standards for three locator or alignment pins to be provided on processing stations or storage locations, and for corresponding slots provided on the bottom of substrate carriers. Locator pins and carrier slots provided in accordance with this standard operate to kinematically position substrate carriers in a precise and predetermined manner on processing stations or storage locations.

It is also known to provide sensors adjacent to the locator pins to allow for automatic detection of the presence of a substrate carrier at a processing station or storage location. The sensors are also employed to detect failure of the substrate carrier to seat properly on the locator pins. Because there are a number of ways in which a substrate carrier may be improperly positioned relative to the three locator pins called for by the SEMI standard, conventional practice to accurately determine positive carrier placement calls for providing at least five sensors at various positions near the three locator pins.

It would be desirable to provide an arrangement in which proper positioning of a substrate carrier on the three locator pins can be reliably detected using fewer than five sensors.

SUMMARY OF THE INVENTION

The invention comprises a wafer carrier locating pin having an integrated wafer carrier sensor. According to an aspect of the invention, the apparatus includes a surface adapted to receive the substrate carrier and a pin body mounted on, and extending upwardly from, the surface. The pin body has a slot formed therein. The apparatus also includes a paddle mounted in the slot of the pin body. The paddle is adapted to be actuated in a downward direction when the substrate carrier is seated on the pin body.

The pin body may have an uppermost point, and the paddle may be movable between a first position and a second position, with the paddle being held in the first position when no substrate carrier is present. According to this aspect of the invention, the paddle does not extend above the uppermost point of the pin body when the paddle is in the first position. The paddle may extend horizontally outwardly in two directions from the uppermost point of the pin body when the paddle is in the first position.

The pin body may have a rounded top and the paddle may be arranged so that it does not extend above any portion of the rounded top of the pin body when the paddle is in the second position.

The apparatus may further include a plunger held inside the pin body and coupled to the paddle for movement in a downward direction when the paddle is actuated. There may also be included in the apparatus a through-beam sensor mounted below the shelf. The through-beam sensor projects a beam that is adapted to be broken by a lower end of the plunger when the paddle is actuated. The apparatus may further include a spring adapted to bias the plunger and the paddle in an upward direction.

In an alternative embodiment of the invention, a through-beam sensor may be mounted adjacent the pin body in a recess of the surface. An actuator may be coupled to the paddle and adapted to break a beam of the through-beam sensor when the paddle is actuated.

According to another aspect of the invention, a station for receiving a substrate carrier is provided. The station includes a surface and three pins mounted on the surface. The three pins define a circle having a center point and each of the pins has a paddle mounted thereon. The paddles are actuatable by a substrate carrier placed on the surface and each paddle is substantially planar and defines a respective plane. Each paddle is mounted on the respective pin such that the plane defined by the paddle is substantially perpendicular to a line extending between the respective pin and the center point of the circle.

By integrating a carrier-sensing device with each locator pin, and arranging the sensing devices such that the sensing devices are actuated only when the pin is correctly engaged in the corresponding slot on the bottom of the carrier, the present invention permits reliable sensing of the correct positioning of the substrate carrier while, in one embodiment, using only three sensors. Thus, in this embodiment the sensing capabilities of a processing station or storage location may be provided at lower cost than conventional substrate carrier sensing arrangements.

Further features and advantages of the present invention will become more fully apparent from the following detailed description of the preferred embodiments, the appended claims and the accompanying drawings.

DESCRIPTION OF THE PREFERRED EMBODIMENTS

Figure 1:
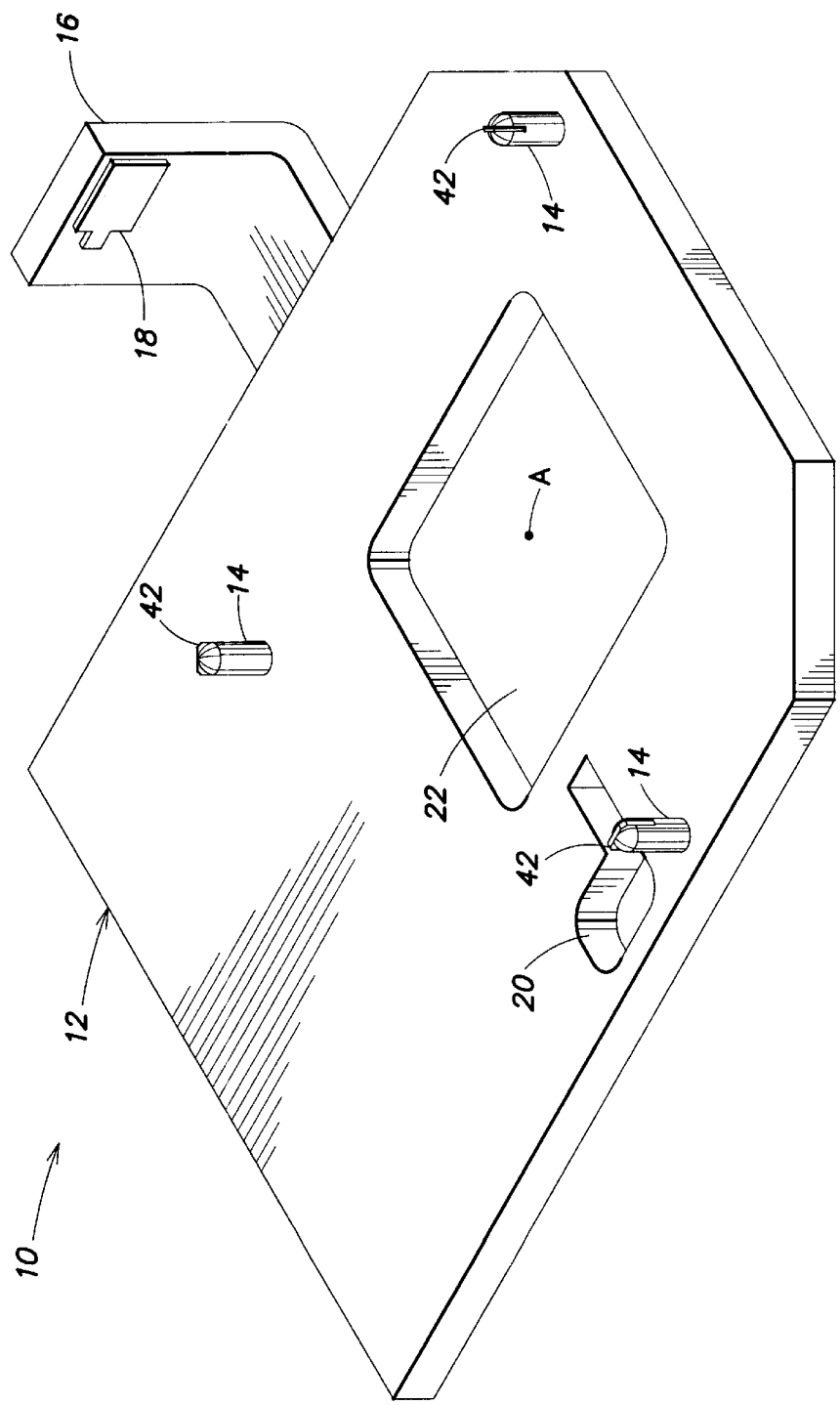
FIG. 1 is an isometric view, from above, of a shelf provided in accordance with one embodiment of the invention and adapted to receive and sense the presence of a substrate carrier.

FIG. 1 is an isometric view, from above, of a station 10 provided to receive and sense the presence of a substrate carrier in accordance with one embodiment of the invention. The station 10 may be, for example, either one of a processing station at which substrates are removed from the substrate carrier, or a storage location at which a substrate carrier may be stored.

The station 10 includes a substantially planar shelf 12 which is adapted to receive a substrate carrier. Mounted on the shelf 12, and extending upwardly therefrom, are three locator pins 14. The locator pins 14 are positioned with respect to each other, and have a height and width, in accordance with the above-mentioned SEMI standard. Also, as will be discussed below, each locator pin 14 is integrated with a sensor for detecting the presence of a substrate carrier.

An angle bracket 16 is mounted at one side of the shelf 12. A beam emitter 18 is mounted near the top of the angle bracket 16 and in a position above and offset to a side of the shelf 12. An L-shaped window 20 is formed in the shelf 12 at a side opposite to the angle bracket 16. In accordance with conventional practice, the L-shaped window 20 is provided to allow the beam (not shown) from the beam emitter 18 to be received by a beam receiver (not shown) mounted on the lower side of the shelf 12. The beam emitter 18 and beam receiver together form a conventional arrangement for generally detecting the presence or absence of a substrate carrier at the shelf 12. As will be seen, the sensors integrated with the locator pins 14 provide an indication of whether the substrate carrier is accurately positioned on the shelf 12.

The shelf 12 also has formed therein a large opening 22 located at a central position relative to the locator pins 14. The opening 22 aids in aligning the shelf 12 during installation thereof, and also reduces the weight of the shelf 12.

Figure 2:
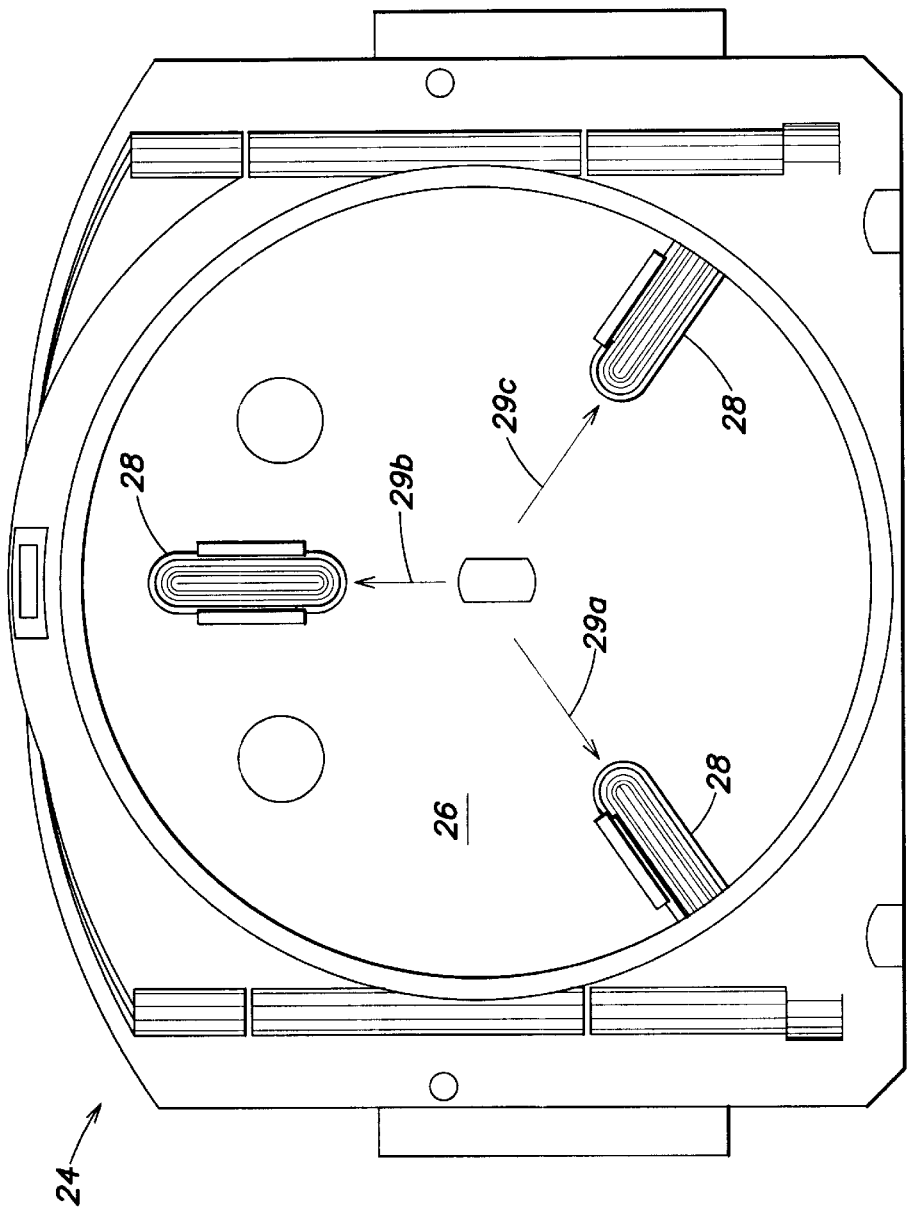
FIG. 2 is a bottom plan view of a conventional substrate carrier.

FIG. 2 is a bottom plan view of a conventional substrate carrier 24. The substrate carrier 24 may be of the type referred to as a front-opening unified pod (FOUP). The substrate carrier 24 is constructed in accordance with the SEMI standard and is adapted to be positioned on the shelf 12. A bottom surface 26 of the substrate carrier 24 includes three slots 28 which have a V-shaped cross section. Slots 28 have respective longitudinal axes in the directions indicated by arrows 29a, 29b, 29c. The slots 28 cooperate with the locator pins 14, when the substrate carrier 24 is placed on the shelf 12, to kinematically position the substrate carrier 24 with correct alignment at an appropriate place on the shelf 12.

Figure 3:
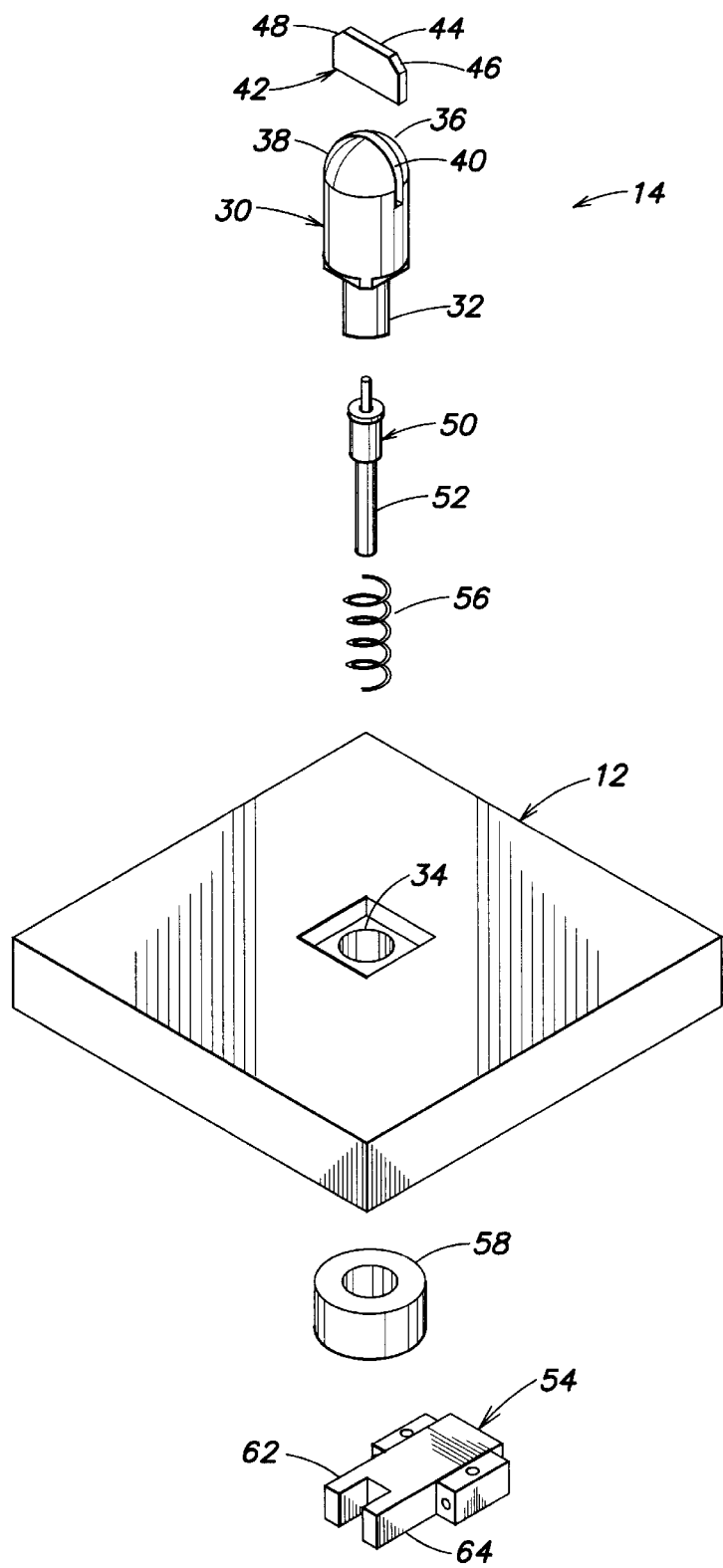
FIG. 3 is an exploded view of an integrated locator pin and substrate carrier sensor provided in accordance with one embodiment of the invention.

FIG. 3 is an exploded view of a typical one of the locator pins 14, showing a sensor mechanism that is integrated with the locator pin 14. The locator pin 14 includes a pin body 30 adapted to be mounted by its base 32 in a hole 34 formed in the shelf 12. The pin body 30 has an upper portion 36 which includes a rounded top 38 and a vertically extending slot 40. The external configuration of the pin body 30 conforms to the SEMI standard for locator pins.

The integrated locator pin/sensor 14 also includes a generally planar paddle 42 which is shaped and sized to fit in the slot 40 of the pin body 30. The paddle 42 has a flat top edge 44 and adjoining cut corners 46, 48. The flat top edge 44 is so the carrier cannot be set on the pins incorrectly and still actuate the sensor. The flat cut corners coincide with the outside shape of the pin body 30 and interact with the carrier in the same fashion as a bare pin with no slot would.

A plunger 50 is adapted to be held inside the pin body 30 and coupled to the paddle 42, so as to be moved downwardly when the paddle 42 is actuated (moved downwardly) by a substrate carrier seated on the pin body 30. As will be seen, a lower end 52 of the plunger 50 is positioned to interrupt a beam of a through-beam sensor 54 when the paddle 42 is actuated.

A coil spring 56 is provided to upwardly bias the plunger 50 and paddle 42 to an unactuated position. Like the plunger 50, the coil spring 56 is received within the pin body 30. A cap 58 is fitted into a counter bore (not shown) in a lower surface of the shelf 12. The cap 58 has threads (not shown) which cooperate with threads (not shown) on the base 32 of the pin body 30 to secure the pin body 30 to the shelf 12.

Figure 4:
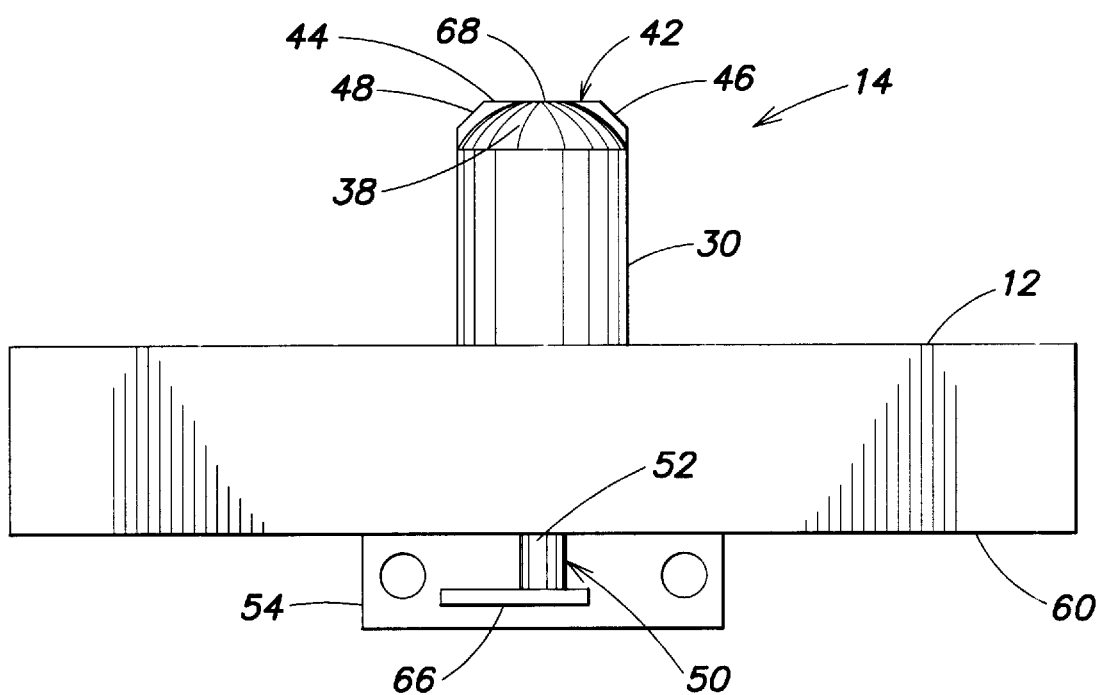
FIG. 4 is a side view of the integrated locator pin and substrate carrier sensor of FIG. 3.

The above-mentioned through-beam sensor 54 may be a conventional device, and may be, for example, a model PM.K 54, manufactured by Sun.X Inc. As best seen in FIG. 4, the through-beam sensor 54 is mounted below the shelf 12 adjacent a lower end 52 of the plunger 50, which extends downwardly below the lower surface 60 of the shelf 12. Referring once more to FIG. 3, the through-beam sensor 54 has prongs 62, 64 between which a beam 66 is projected. (The beam 66 is not shown in FIG. 3 but is seen in FIG. 4.)

Referring again to FIG. 4, it will be seen that the rounded top 38 of the pin body 30 has an uppermost point 68. The paddle 42 is shown in its unactuated position in FIG. 4; i.e. in the position in which the paddle 42 is held when no substrate carrier is present. When the paddle 42 is in its unactuated position, the top edge 44 of the paddle 42 is in a tangential relationship with the uppermost point 68 of the rounded pin body 30. In other words, the paddle 42 does not extend above the uppermost point 68 of the pin body 30, but does extend horizontally outwardly in a rightward direction and a leftward direction from the uppermost point 68 of the pin body 30. This configuration again precludes a carrier or any other item from setting atop the pins and giving a false carrier placed status. Only when the cut corners 46, 48 engage a slot in the carrier will the pin operate as designed. If the carrier were rotated slightly, and the corner of the slot were placed on the cut corner of the paddle, the slope of the cut corner would allow the carrier to slide off the paddle 42, and from there the substrate carrier will either seat into a properly placed condition, or it will not, depending in part on the orientation of the slot. In either case, the sensor would be able to make an accurate determination as to whether the substrate carrier is properly placed.

The orientations of the paddles 42 of the three locator pins 14 relative to the shelf 12 will now be discussed with reference once more to FIG. 1. It will be observed from FIG. 1 that the three locator pins 14 define a circle having a center point located at A in FIG. 1. Each paddle 42 is mounted in its respective locator pin 14 and oriented such that the plane defined by the respective paddle 42 is substantially perpendicular to a line that may be drawn from point A to the respective locator pin 14. In other words, it may be said that the paddles 42 face the central point A of the circle defined by the locator pins 14.

Referring to FIG. 2, it will be appreciated that the lines which may be drawn from point A in FIG. 1 to the pins 14 will coincide with the longitudinal axes (represented by arrows 29a, 29b and 29c in FIG. 2) of the slots 28 of the substrate carrier 24 when the substrate carrier 24 is properly positioned relative to the locator pins 14. Consequently, when the wafer carrier 24 is properly seated on the locator pins 14, the planes of the paddles 42 will each be perpendicular to the sloping sides of the corresponding one of the slots 28 of the substrate carrier 24. Accordingly, it will be recognized that the orientations of the paddles 42 are optimized for the paddles 42 to be engaged by the slots 28 of the substrate carrier 24 when the substrate carrier 24 is positioned on the locator pins 14.

Figure 5:
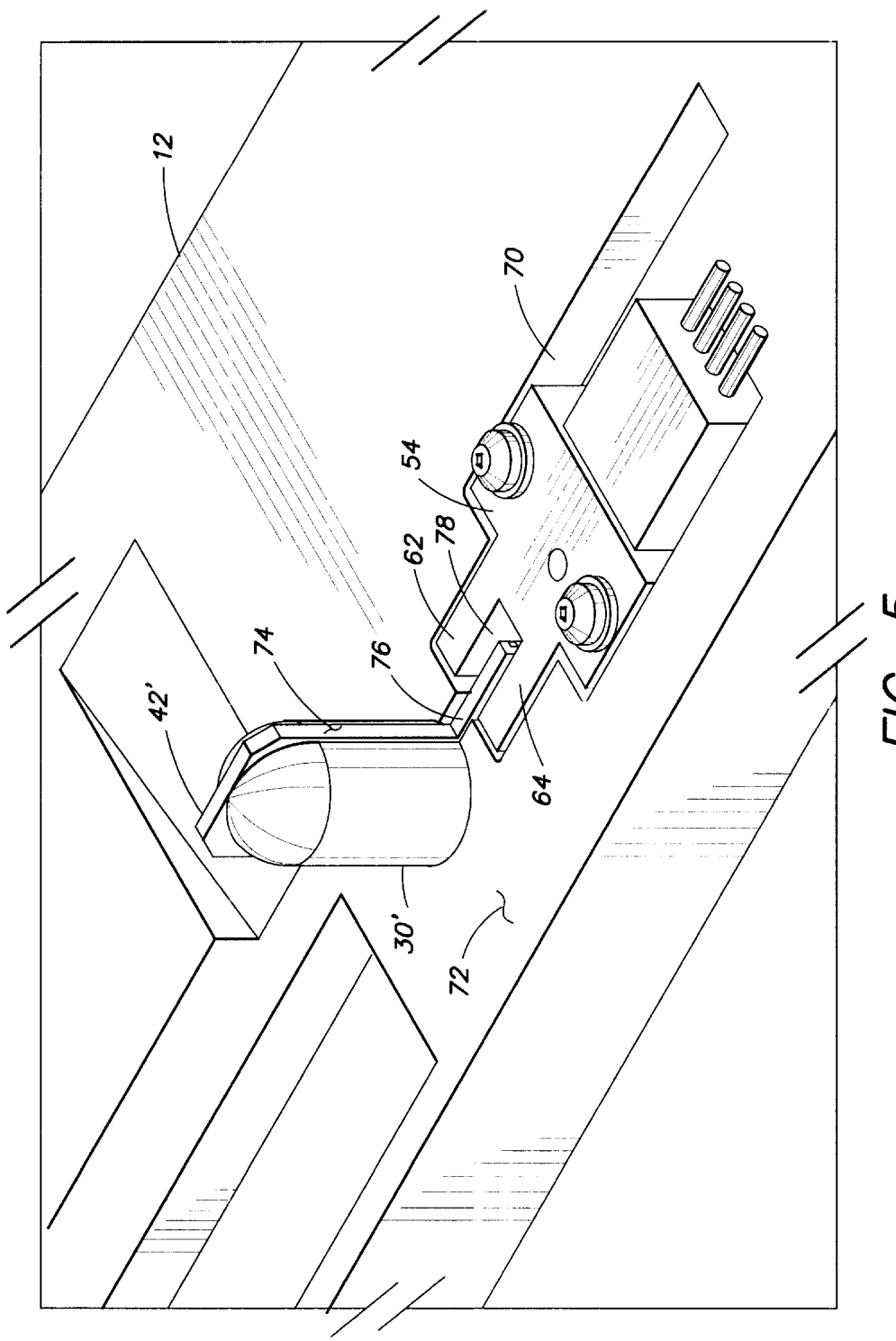
FIG. 5 is an isometric view of an integrated locator pin and substrate carrier sensor provided according to an alternative embodiment of the invention.

FIG. 5 illustrates an alternative embodiment of the invention, in which the through-beam sensor 54 is not mounted below the shelf 12. Rather, as seen from FIG. 5, the through-beam sensor 54 is mounted in a recess 70 formed in an upper surface 72 of the shelf 12. An advantage of the embodiment of FIG. 5 is that no space is taken up by the through-beam sensor 54 below the shelf 12, so that the overall vertical profile of the arrangement is reduced, and shelves may be spaced at a closer spacing in the vertical direction.

Continuing to refer to FIG. 5, the paddle 42' is integrally formed with an L-shaped actuator 74. The actuator 74 has a horizontal extension 76 that enters a gap 78 between prongs 62, 64 of the through-beam sensor 54. The horizontal extension 74 is below the top surface of shelf 12 so as to preclude false actuation. When the paddle 42' is actuated by a substrate carrier seated on the pin body 30', the paddle 42', its integral actuator 74, and the horizontal extension 76 all move downwardly, causing the horizontal extension 76 to interrupt a beam (not shown) projected in the gap 78 between the prongs 62, 64 of the through-beam sensor 54.

In operation, the integrated locator pins/substrate carrier sensors may be either in an unactuated condition or in an actuated condition. When no substrate carrier is present, the integrated locator pins/substrate carrier sensors are in an unactuated condition as illustrated in FIG. 4. The paddle 42 and plunger 50 are biased in an upward direction by spring 56. The paddle 42 of each locator pin/sensor extends horizontally outwardly relative to the uppermost point 68 of the pin body 30, but does not extend above the uppermost point 68 so as to preclude false actuation. The lower end 52 of the plunger 50 extends below the shelf 12, but does not extend downwardly far enough to interrupt the beam 66 of the through-beam sensor 54.

When a substrate carrier is seated on the pins 14, the sides of slots 28 (FIG. 2) engage the top edges 44 and/or the cut corners 46, 48 of the paddles 42, actuating the paddles and moving the paddles downward against the biasing force of the spring 56 (FIG. 3). In the case of each pin 14, the respective plunger 50 is also moved downward so that the lower end 52 of the plunger 50 breaks the beam 66 of the through-beam sensor 54. As a result, the through-beam sensor 54 associated with each pin 14 transmits a signal to a controller (not shown) to indicate actuation of the respective locator pin/sensor 14. When in its actuated position, the paddle 42 is entirely within the pin body 30, so that the locator pin 14 as a whole conforms to the SEMI standard. Only when the sensor 54 associated with each pin sends a signal to the controller does the controller assume a wafer carrier is properly positioned thereon.

Because of the configuration of the pin body 30 and the paddle 14, if a substrate carrier is not properly seated with its slot 28 properly engaging the pin body 30, but rather with the substrate carrier simply resting on top of the pin body 30, then the paddle 42 will not be actuated, since the paddle 42 does not extend above the uppermost point 68 of the pin body 30. Consequently, locator pins/sensors 14 do not emit "false positive" signals, but only are actuated by properly positioned substrate carriers. As a result, only the three sensors, integrated with, respectively, the three locator pins 14, are required to accurately and reliably indicate that a substrate carrier is properly positioned on the pins 14. Moreover, placement of the carrier 24 on the pins 14 without the slots 28 of the carrier 24 properly seated on the pins 14 will not result in a false indication that the carrier 24 has been properly placed on the shelf 12.

The shelf 12 and its locator pins/substrate carrier sensors 14 is suitable for use in connection with a distributed substrate carrier storage facility such as that disclosed in a co-pending and commonly-assigned U.S. patent application entitled "Apparatus for Storing and Moving a Cassette", Ser. No. 09/201,737, filed Dec. 1, 1998, and incorporated herein by reference in its entirety.

The foregoing description discloses only a preferred embodiment of the invention; modifications of the above disclosed apparatus which fall within the scope of the invention will be readily apparent to those of ordinary skill in the art. For instance, it will be apparent that the specific embodiments of the inventive locator pin/substrate carrier sensors described herein are configured for use with the present SEMI standard locator pin and cassette slot, and revision of either of these standards may change the specific configuration of the locator pin/substrate carrier sensor embodiments. Further, it will be understood that the specific configuration of the pin, slot, paddle, plunger and sensor, etc., may vary and still fall within the scope of the invention. The plunger and the paddle may be integral. The plunger and paddle may assume various shapes. The plunger slot need not extend vertically and need not be formed near the top of the pin. Other types of sensors may be employed, and the number of pins may vary. Accordingly, while the present invention has been disclosed in connection with preferred embodiments thereof, it should be understood that other embodiments may fall within the spirit and scope of the invention, as defined by the following claims.

The invention claimed is:

1. Apparatus for sensing the presence of a substrate carrier, comprising:
   a surface adapted to receive the substrate carrier;
   a pin body adapted to seat the substrate carrier mounted on, and extending upwardly from, the surface, the pin body having a vertically-extending slot formed therein and an uppermost point; and
   a paddle mounted in the slot of the pin body, the paddle adapted to assume an unactuated position at which it extends outside the pin body to a lateral extent not above the uppermost point of the pin body, to be moved in a downward direction toward an actuated position as the substrate carrier is lowered into the pin body, and to assume an actuated position entirely within the pin body when the substrate carrier is seated on the pin body.

2. The apparatus of claim 1, wherein the pin body has an uppermost point, the paddle being movable between a first position at which the paddle extends outside the pin body to a lateral extent not above the uppermost point of the pin body, and a second position entirely within the pin body, the paddle being held in the first position when no substrate carrier is present.

3. The apparatus of claim 2, wherein the paddle extends horizontally outwardly in two directions from the uppermost point of the pin body when the paddle is in the first position.

4. The apparatus of claim 3, wherein the paddle does not extend above any portion of the pin body when the paddle is in the second position.

5. The apparatus of claim 1, further comprising a plunger inside the pin body adapted for movement in a downward direction when the paddle is actuated.

6. The apparatus of claim 5, further comprising a through-beam sensor mounted below the surface, the through-beam sensor projecting a beam that is adapted to be broken by a lower end of the plunger when the paddle is actuated.

7. The apparatus of claim 6, further comprising a spring adapted to bias the plunger and the paddle in an upward direction.

8. The apparatus of claim 1, further comprising:
   a through-beam sensor mounted adjacent the pin body in a recess surface of the surface; and
   an actuator integrally formed with the paddle and adapted to break a beam of the through-beam sensor when the paddle is actuated.

9. A station for receiving a substrate carrier, comprising:
   a surface;
   three pins mounted on the surface, the three pins defining a circle having a center point, each pin having a paddle mounted thereon, the paddles being actuatable via direct contact between the paddles and a substrate carrier placed on the surface, each paddle being substantially planar and defining a respective plane, each paddle being mounted on the respective pin such that the plane defined by the paddle is substantially perpendicular to a line extending between the respective pin and the center point of the circle, and such that the paddles, when not actuated, do not extend above an uppermost point of the pin.

10. The station of claim 9, wherein each pin has formed therein a vertically-extending slot in which the respective paddle is mounted.

11. The station of claim 10, further comprising three through-beam sensors each operatively coupled to a respective one of the pins so as to be actuated by an actuation member coupled to a respective one of the paddles.

12. A method of sensing the presence of a substrate carrier, comprising:
   mounting a pin body on a surface adapted to receive the substrate carrier, the pin body extending upwardly from the surface and having a slot formed at an upper portion of the pin body;
   mounting a paddle in the slot of the pin body such that when not actuated, the paddle will not extend above an uppermost point of the pin body, and when actuated the paddle will be entirely within the pin body; and
   actuating the paddle in a downward direction when the substrate carrier is seated on the pin body.

13. The method of claim 12, wherein the pin body has an uppermost point, the paddle being movable between a first position and a second position, the paddle being held in the first position when no substrate carrier is present, the paddle not extending above the uppermost point of the pin body when the paddle is in the first position.

14. The method of claim 12, further comprising breaking a beam of a through-beam sensor in response to the actuation of the paddle.

15. The method of claim 14, wherein the beam is broken by a plunger coupled to the paddle.

16. The method of claim 14, wherein the beam is broken by an L-shaped actuator integrally formed with the paddle.

17. The method of claim 12, further comprising biasing the paddle in an upward direction.

18. A sensor integrated with a locator pin, comprising:
   a pin body having a slot formed in the pin body; and
   a paddle mounted the slot of at an upper portion of the pin body, the paddle adapted to assume an unactuated position at which the paddle does not extend above an uppermost point of the pin body, to be moved in a downward direction toward an actuated position, and to be actuated and entirely within the pin body when a substrate carrier is seated on the pin body; and a sensor adapted to provide a signal when the paddle is in an actuated position.

19. The sensor integrated with a locator pin of claim 18, wherein the pin body has an uppermost point, the paddle being movable between a first position and a second position, the paddle being held in the first position when no substrate carrier is present, the paddle not extending above the uppermost point of the pin body when the paddle is in the first position.

20. The sensor integrated with a locator pin of claim 19, wherein the paddle extends horizontally outwardly in two directions from the uppermost point of the pin body when the paddle is in the first position.

21. Apparatus for sensing the presence of a substrate carrier, comprising:
   a pin body mounted on, and extending upwardly from, a surface adapted to receive a substrate carrier; and
   an actuatable member within the pin body adapted to assume a first, unactuated position in which the member extends outside the pin body to a lateral extent below an uppermost point of the pin body for directly contacting a substrate carrier received by the surface, and a second, actuated position in which the member is entirely within the pin body.

22. The apparatus of claim 21, wherein the actuatable member comprises a paddle.

23. The apparatus of claim 22, wherein the paddle is mounted within a vertically-extending slot formed in the pin body.

24. The apparatus of claim 23, wherein the vertically-extending slot is formed in an upper portion of the pin body.

25. The apparatus of claim 24, wherein the vertically-extending slot extends through the uppermost point of the pin body.

26. The apparatus of claim 21, further comprising a plunger within the pin body and adapted so as to move in a downward direction when the actuatable member is actuated.

27. The apparatus of claim 26, further comprising a through-beam sensor for generating a beam and sensing when the beam is broken by the plunger.

* * * * *